(12) United States Patent
Nairn (10) Patent No.: US 6,771,203 B1
(45) Date of Patent: Aug. 3, 2004

(54) TEMPORALLY-INTERLEAVED PARALLEL ANALOG-TO-DIGITAL CONVERTERS AND METHODS

(75) Inventor: David Graham Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/426,648

(22) Filed: Apr. 29, 2003

(51) Int. Cl.$^7$ ................................................ H03M 1/36
(52) U.S. Cl. ...................................... 341/159; 341/155
(58) Field of Search ................................. 341/159, 155, 341/156, 118, 126, 120

(56) References Cited

U.S. PATENT DOCUMENTS

| | | | | |
|---|---|---|---|---|
| 4,968,988 A | * | 11/1990 | Miki et al. ................... | 341/141 |
| 6,160,508 A | | 12/2000 | Gustavsson et al. ........ | 341/155 |
| 6,351,227 B1 | * | 2/2002 | Rudberg ...................... | 341/118 |
| 6,392,575 B1 | | 5/2002 | Eklund ......................... | 341/141 |
| 6,522,282 B1 | * | 2/2003 | Elbornsson .................. | 341/155 |
| 6,542,017 B2 | * | 4/2003 | Manganaro ................... | 327/291 |

OTHER PUBLICATIONS

Jin, Huawen, et al., "Time–Interleaved A/D Converter with Channel Randomization", 1997 IEEE International Symposium on Circuits and Systems, Jun. 9–12, Hong Kong, pp. 425–428.

Tamba, Mamoru, et al., "A Method to Improve SFDR with Random Interleaved Sampling Method", ITC International Test Conference, Paper 18.3, pp. 512–520, no date.

* cited by examiner

Primary Examiner—Brian Young
Assistant Examiner—John Nguyen
(74) Attorney, Agent, or Firm—Koppel, Jacobs, Patrick & Heybl (57) ABSTRACT

Parallel analog-to-digital converter systems are provided in which converters are temporally interleaved. In particular, converters are partitioned into at least two converter groups which are assigned different respective group converter periods that are multiples of the system periods. With converters in each of the converter groups, respective samples are processed over that group's respective group converter period and the group converter periods of all converters are temporally shifted to process each of the samples with at least one of the converters. System spurious signals are thus reduced and, in another system embodiment, the reduced spurious lines are converted into the system's noise level by detecting instances when available converters that belong to different converter groups are available to process an upcoming one of the samples and, in at least a chosen one of the instances, exchanging the available converters between their different converter groups to thereby alter which processes the upcoming sample and which processes a subsequent sample. All converters continue to process respective samples.

32 Claims, 9 Drawing Sheets

TEMPORALLY-INTERLEAVED PARALLEL ANALOG-TO-DIGITAL CONVERTERS AND METHODS

BACKGROUND OF THE INVENTION

1. Field of the Invention

The present invention relates generally to parallel analog-to-digital converter systems.

2. Description of the Related Art

Extremely high conversion rates may be obtained by operating a plurality of analog-to-digital converters in a parallel converter system. For example, analog input signals can be converted to a corresponding digital code at speeds up to a system rate $f_S$ by paralleling M converters that each process samples of the analog input signal at a maximum converter rate $f_S/M$. Stated differently, M converters that are each limited to a maximum converter rate $f_{cnvrtr}$ can be combined to realize a system rate of $Mf_{cnvrtr}$.

However, when parallel converters are operated in a fixed sequence (e.g., A, B, C, A - - - ), it has been found that parameter mismatches between the converters (e.g., gain, offset and timing mismatches) generate conversion errors which exhibit repetitive patterns that generate spurious signals in the spectrum of the output digital code.

It has been found that the spurious signals can be reduced by altering the fixed sequence in which the parallel converters are operated. In a parallel system in which the converters are pipelined converters, for example, the residue of a converter stage of one converter has been directed to a subsequent stage in a randomly-selected one of the other converters. This structure has been found to reduce the spurious signals but is quite complex and does not address parameter mismatch in the system's samplers.

It has also been found that the spurious signals can be reduced by adding at least one additional converter to a parallel system so that at least one converter is idling at any given moment. A random choice is made between the idling converter and a converter that has just completed its conversion and the chosen converter processes a successive sample. This system does not insure that all converters are constantly processing signals and, accordingly, a converter may remain idle for some time which leads to conversion errors in converters that include switched-capacitor structures.

BRIEF SUMMARY OF THE INVENTION

The present invention is directed to parallel converters and methods that reduce spurious signals in systems that provide samples of an analog input signal in successive system periods.

In a system embodiment of the invention, a plurality of analog-to-digital converters are partitioned into at least two converter groups which are assigned different respective group converter periods that are multiples of the system periods. With converters in each of the converter groups, respective samples are processed over that group's respective group converter period and the group converter periods of all converters are temporally shifted to process each of the samples with at least one of the converters.

In another embodiment, the reduced spurious lines are converted into the system's noise level by detecting instances when available converters that belong to different converter groups are available to process an upcoming one of the samples and, in at least a chosen one of the instances, exchanging the available converters between their different converter groups to thereby alter which processes the upcoming sample and which processes a subsequent sample. All converters continue to process respective samples.

The novel features of the invention are set forth with particularity in the appended claims. The invention will be best understood from the following description when read in conjunction with the accompanying drawings.

DETAILED DESCRIPTION OF THE INVENTION

Figure 1:
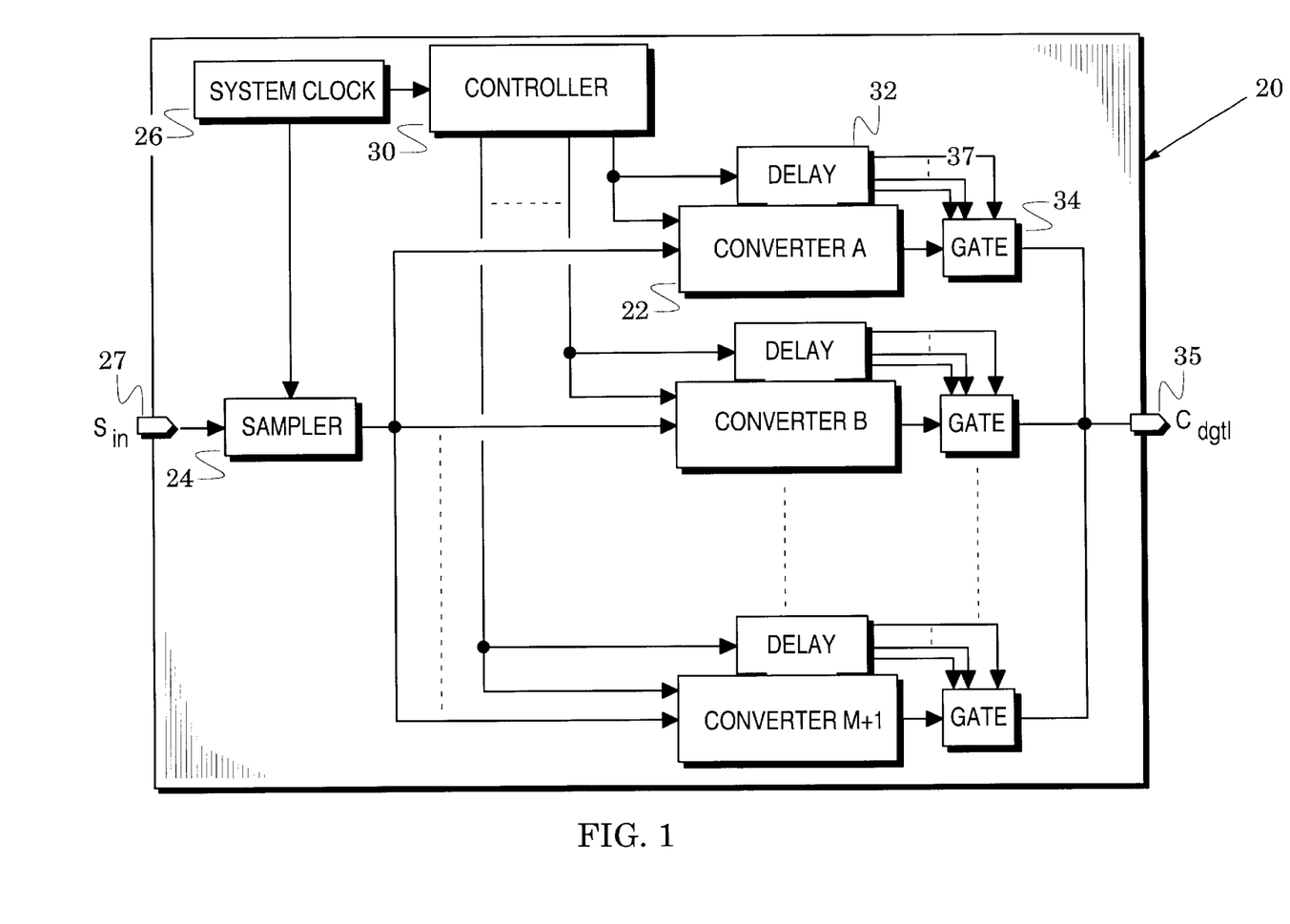
FIG. 1 is a block diagram of an analog-to-digital converter system embodiment of the present invention.
Figure 2A:
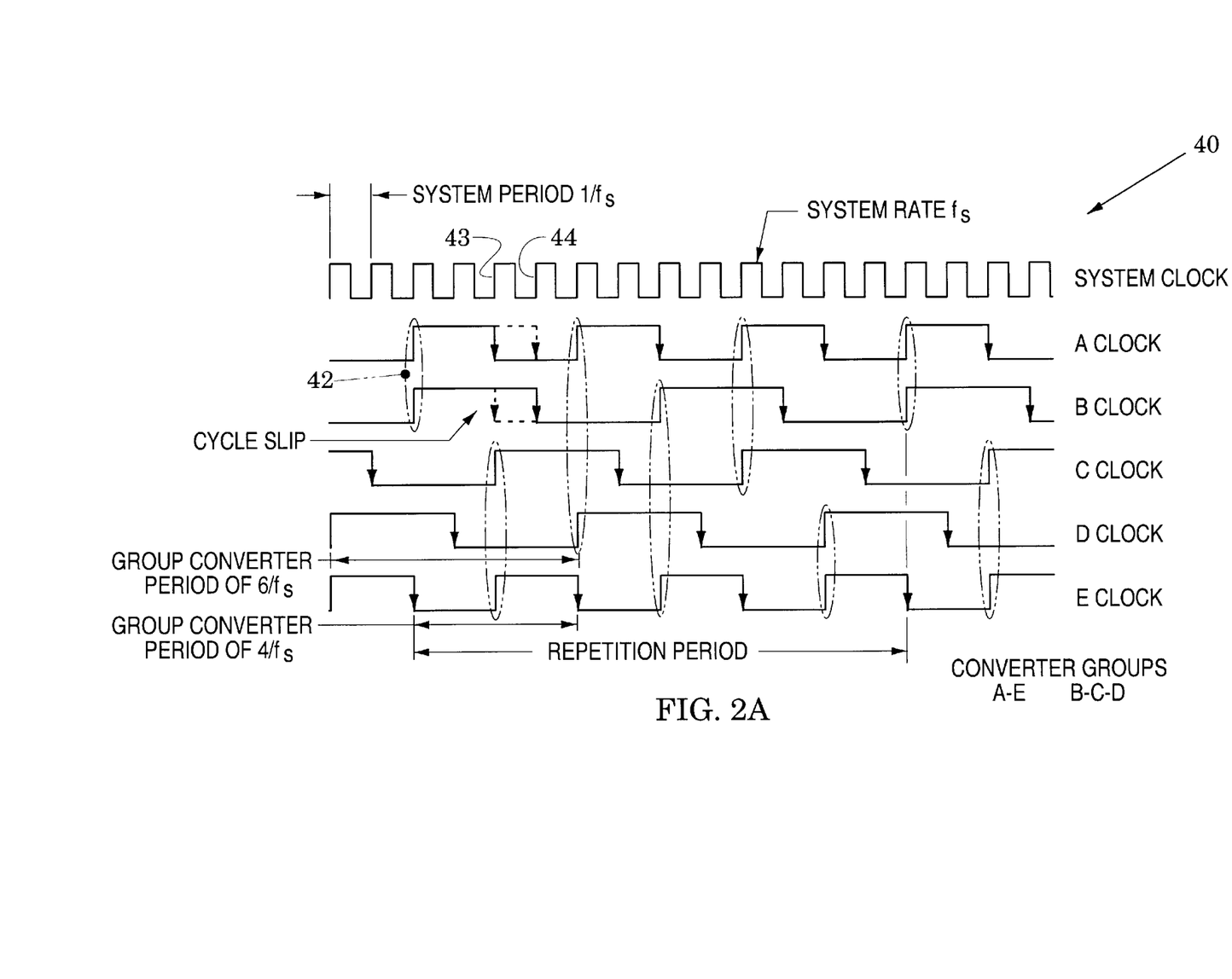
FIGS. 2A–2E are timing diagrams that illustrate exemplary converter periods of converters in the block diagram of FIG. 1.
Figure 2B:
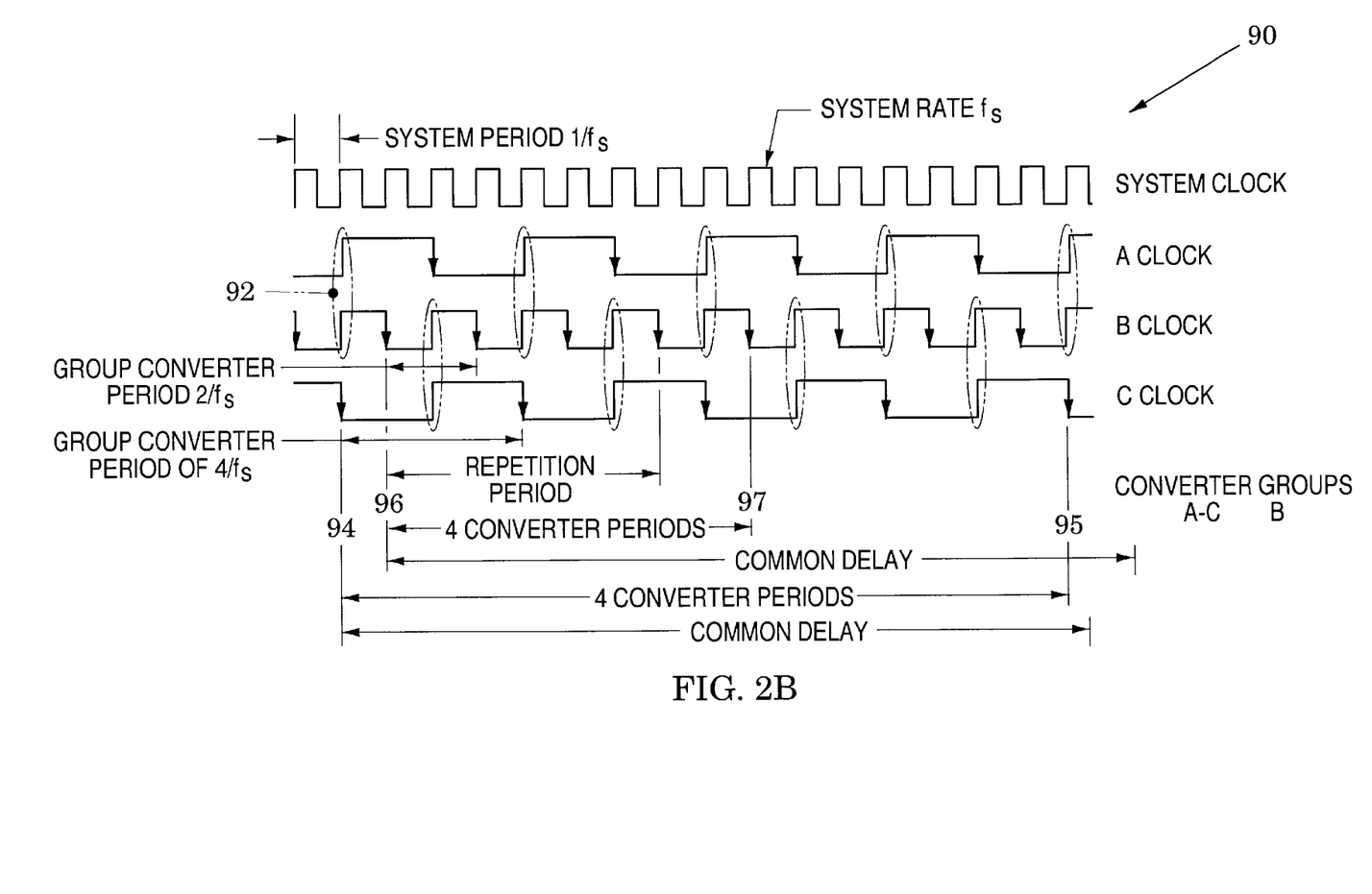
Figure 2C:
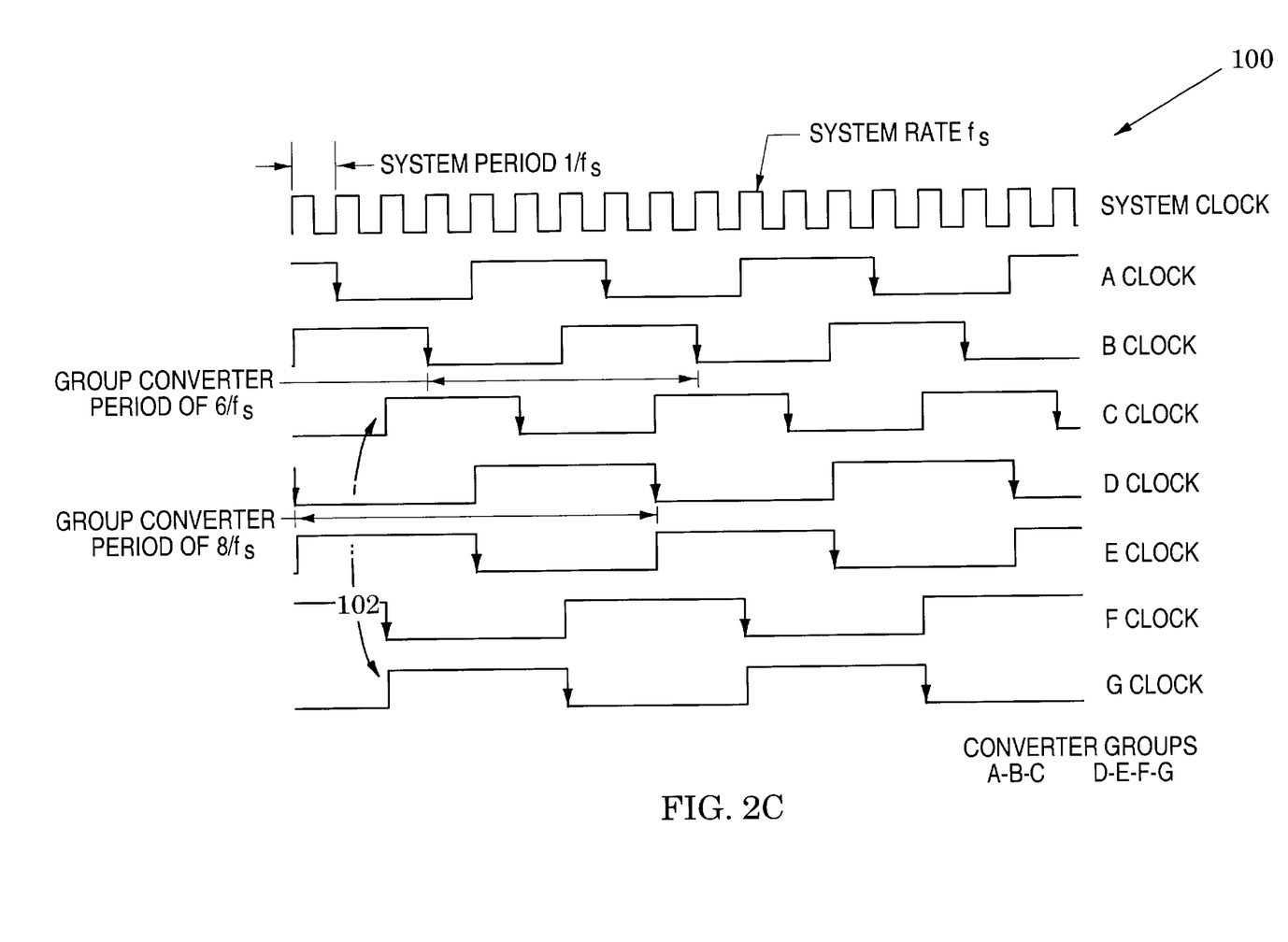
Figure 2D:
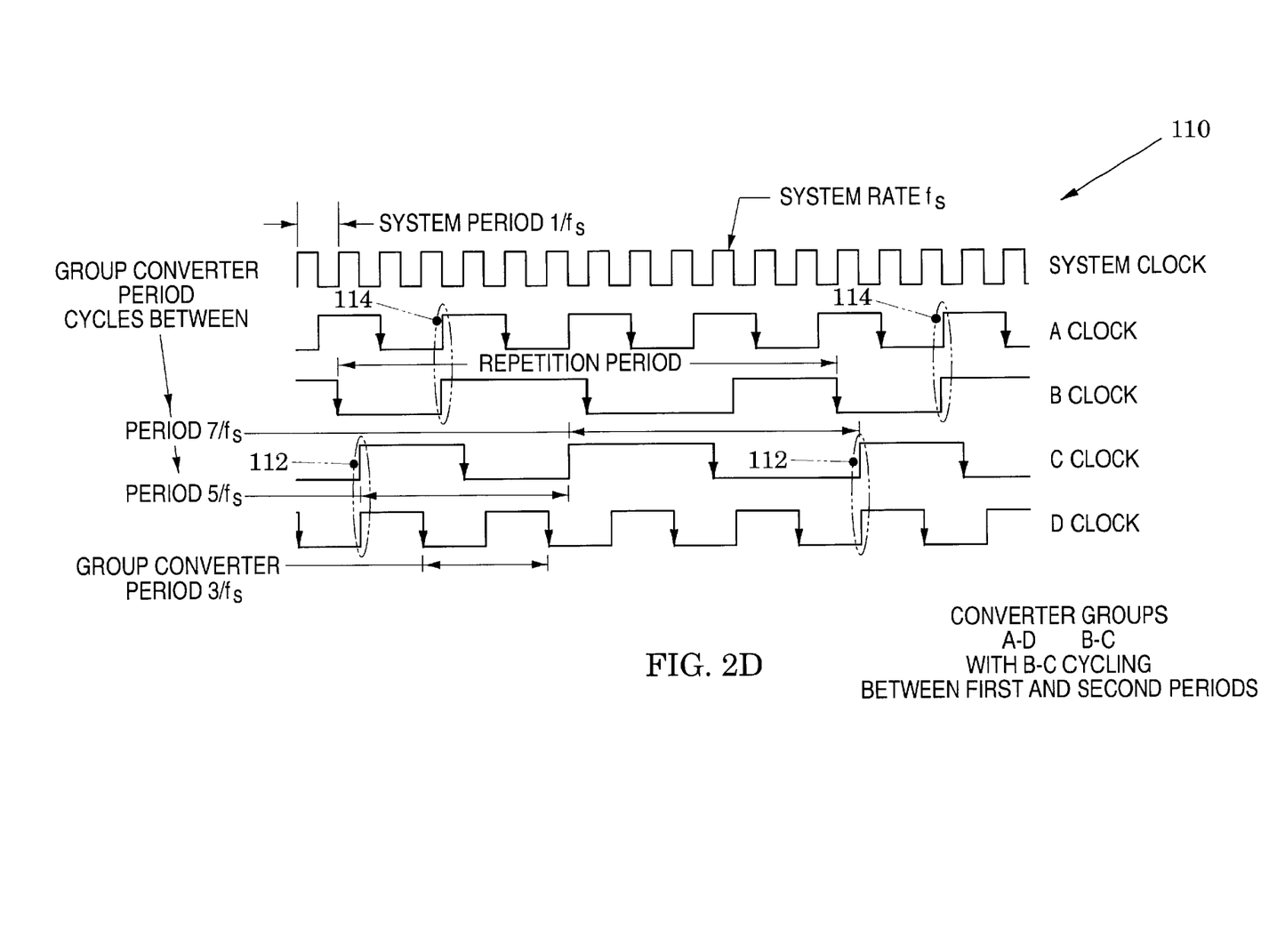
Figure 2E:
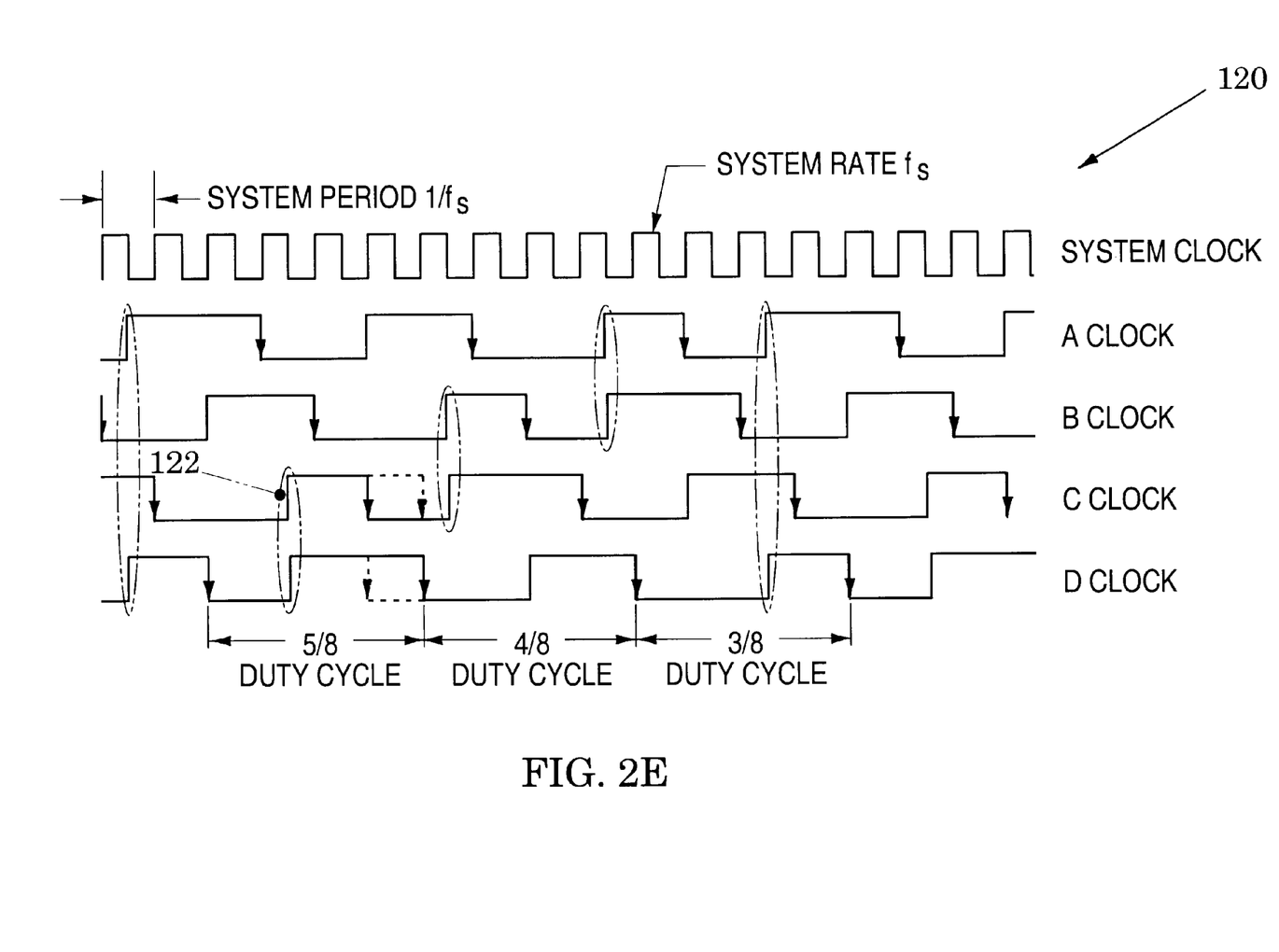
Figure 3:
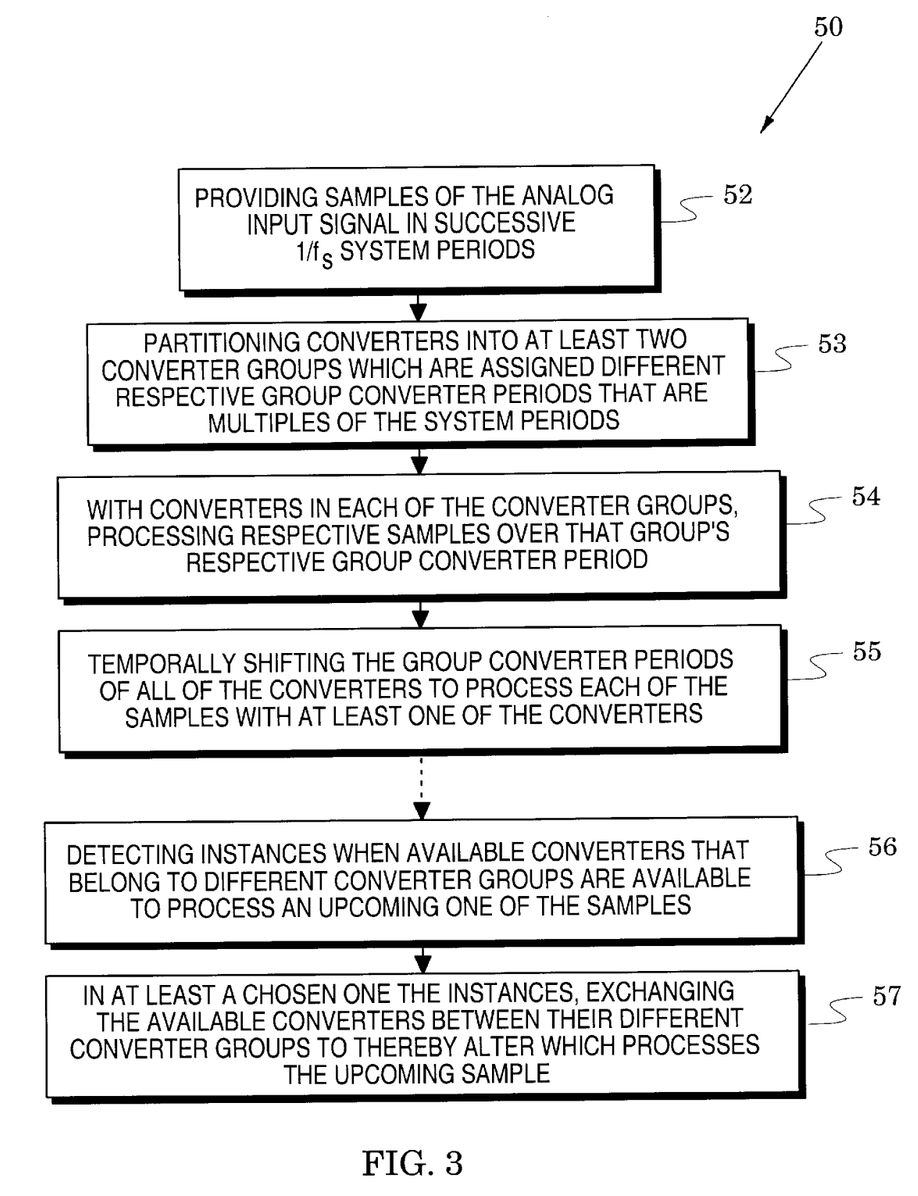
FIG. 3 is a flow chart that illustrates processes in the system of FIG. 1, FIGS. 4A, 4B and 4C are graphs which illustrate improvements in the digital-code spectrum of the system of FIG. 1 that are realized with the timing diagrams of FIGS. 2A–2E and processes of FIG. 3.

Features of the present invention are illustrated in FIGS. 1–5. Embodiments of converter structure are shown in FIG. 1 and embodiments of converter processes are shown in FIG. 3. The advantages of these structures and processes are described with reference to exemplary timing diagrams of FIGS. 2A–2E with reference to spectral diagrams of FIGS. 4A–4C and to matching requirements of FIG. 5.

In particular, the converter system 20 of FIG. 1 is based on the assumption that a system conversion rate $f_S$ is desired but only converters 22 having a maximum converter rate $f_S/M$ are available (wherein M is an integer). In one embodiment of the system, it is further assumed that the converters are pipelined converters which each have a plurality of converter stages. A sampler 24 responds to a system clock 26 (which runs at the system rate $f_S$) and provides samples of an analog input signal $S_{in}$ at an input port 27 to the converters 22.

A controller 30 also responds to the system clock and provides converter clocks to the converters 22. The converter clocks are also provided to delay generators 32 that are associated with each of the converters. These generators provide gating signals to gates 34 that pass the outputs of the converters with timing that correctly forms the final converted digital code $C_{dgtl}$ at an output port 35.

The operation of the converter system 20 can be illustrated with reference to the exemplary converter timing diagram 40 of FIG. 2A and to the flow chart 50 of FIG. 3. Process 52 of the flow chart provides samples of the analog input signal in successive $1/f_S$ system periods as illustrated in FIG. 2A which shows the system clock with a system rate $f_S$ and a corresponding system period of $1/f_S$.

In accordance with the invention, M+k converters are provided and the timing diagram of FIG. 2A, in particular, assumes an embodiment in which M=4 and k=1 so that converters A through E are available (i.e., FIG. 2A indicates clock signals A–E so that converter M+1 in FIG. 1 is converter E in FIG. 2A). In an important feature of the invention, process 53 of the flow chart 50 partitions these converters into at least two converter groups which are assigned different respective group converter periods that are multiples of the system periods.

As shown by their clock signals in FIG. 2A, converters A and E are members of a first converter group that is assigned a group converter period of $4/f_S$ (i.e., they run at a converter rate $f_S/4$). Similarly, converters B, C and D are members of a second converter group that is assigned a group converter period of $6/f_S$ (i.e., they run at a slower converter rate $f_S/6$).

It is noted that downward-directed arrows in each of the clock waveforms of FIG. 2A bound a converter period which comprises a hold or evaluate phase (low portion of the waveform) and a sample phase (high portion of the waveform) with the sample available at the arrow that terminates the sample phase. For example, each converter stage of a pipelined converter generally receives the same converter clock signal and, in response, samples its input during its respective sample phase and subsequently enters its respective hold phase. The sample and hold phases of adjacent converter stages are 180° out of phase so that a succeeding converter stage can sample the held output of a preceding converter stage.

With converters in each of the converter groups, process step 54 of FIG. 3 processes respective ones of the samples (from sampler 24 in FIG. 1) over that group's respective group converter period. For example, converters A and E of FIG. 2A process respective samples over a group converter period of $4/f_S$ and converters B, C and D process respective samples over a group converter period of $6/f_S$.

Process step 55 of FIG. 3 temporally shifts the group converter periods of all of the converters to process each of the samples with at least one of the converters. This is evident in FIG. 2A where the A through E clocks have been temporally shifted so that each sample (that corresponds to a respective system period $1/f_S$) is converted by a respective one of the converters A through E. The final A through E clock signals of FIG. 2A are provided by the controller 30 of FIG. 1 in response to the system clock of FIG. 2A (provided by the system clock 26 in FIG. 1).

Although system embodiments of the invention enhance their spectral output with the converter timing shown in FIG. 2A, another important feature of the invention enhances this output by exchanging converters between converter groups at selected points in the system timing. In particular, process step 56 of FIG. 3 detects instances when available converters that belong to different converter groups are available to process an upcoming one of the samples. Subsequently, process step 57, in at least a chosen one of the instances, exchanges the available converters between their different converter groups to thereby alter which of the available converters processes the upcoming sample and which processes a subsequent sample.

In one embodiment of the invention, the instances are detected by means of corresponding clock edges. This process is exemplified by broken-line ellipses 42 in FIG. 2A which indicate coincidence of rising clock edges which identifies pairs of converters that are entering their sample phase and are thus available to process an upcoming sample. The ellipse in the upper left corner of FIG. 2A, for example, indicates that converters A and B have entered their sample phase and are available to convert an upcoming sample.

The A and B clock signals are presently configured so that converters A and B (in FIG. 1) will convert samples corresponding respectively to rising edges 43 and 44 of the system clock in FIG. 2A. In accordance with the invention, these converters are exchanged between their converter groups so that converter B converts the sample corresponding to the rising edge 43 and converter A converts the sample corresponding to the rising edge 44.

In a particular embodiment, multiples (one in this example) of the $1/f_S$ system period are inserted into the group converter period corresponding to converter A and multiples (one in this example) of the $1/f_S$ system period are subtracted from a group converter period corresponding to converter B. This alteration of group converter periods is indicated in the broken lines in FIG. 2A labeled "cycle slip". Subsequently, converter B will convert samples in accordance with the A clock and converter A will convert samples in accordance with the B clock.

This example of cycle-slipping can be carried out at selected ones of the other broken-line ellipses in FIG. 2A which indicate other instances when available converters that belong to different converter groups are available to process an upcoming one of the samples. Selection of the instances in which the exchange is actually effected may be made (in the controller 30 of FIG. 1) with various selection processes, e.g., pseudorandomly or randomly. A random selection, for example, will determine whether converter A converts the sample corresponding to the rising edge 43 of the system clock in FIG. 2A (in accordance with the A clock) or the sample corresponding to the rising edge 44 (in accordance with the B clock).

Figure 4A:
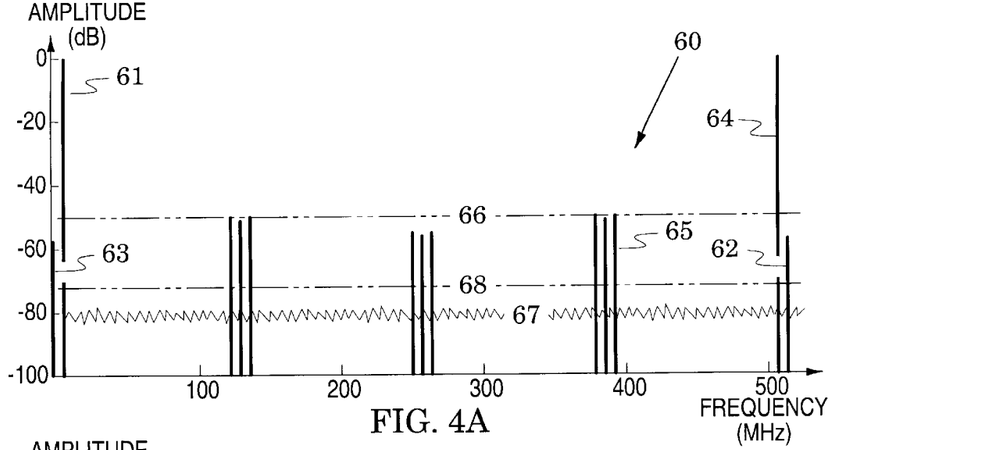
Figure 4B:
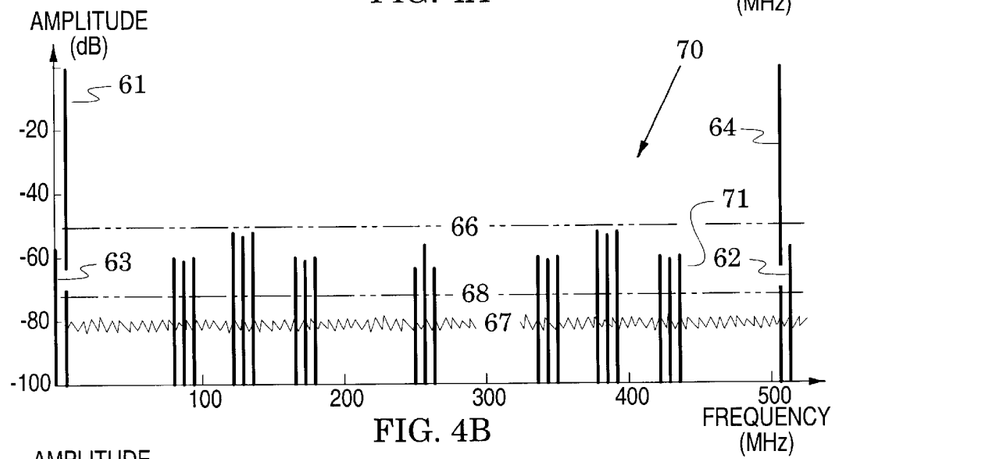
Figure 4C:
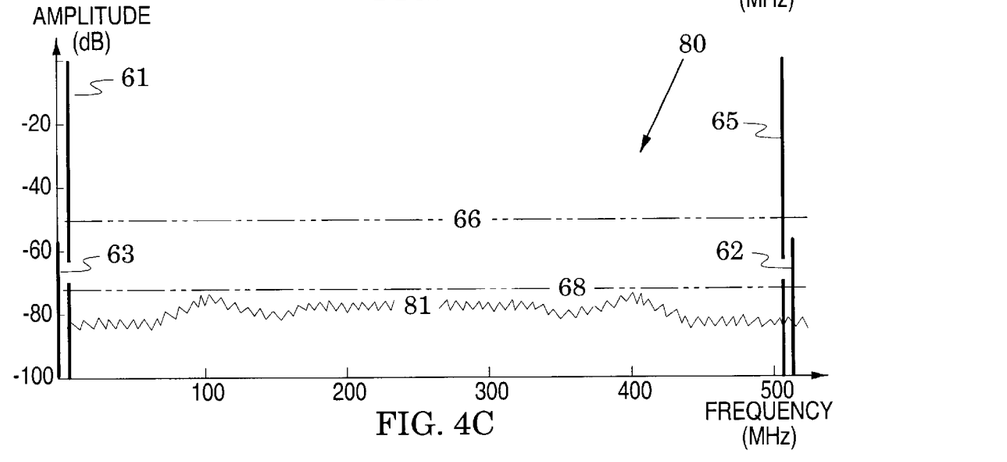

The spectral graphs of FIGS. 4A, 4B and 4C illustrate improvements in the output spectrum of the system 20 of FIG. 1 that are realized with the converter timing of FIG. 2A. To understand these graphs, it is recalled that the converter system 20 of FIG. 1 may be used to achieve a system conversion rate $f_S$ with M+k converters that have a maximum converter rate $f_S/M$.

Conventional systems have achieved this same system rate by sequencing M converters in a fixed sequence (e.g., A, B, C, D, A - - - ). The resulting spectrum is shown in the simulation 60 of FIG. 4A for a converter system in which a 7 MHz analog signal (spectral line 61) is converted to an 8-bit digital code with four converters that sequentially process samples which are provided at a 512 MHz rate. The average offset of the converters generates a spectral line 62 at the 512 MHz rate and its image line 63 at the origin. The image 64 of the spectral line 61 appears at 512−7=505 MHz.

Because of gain and offset mismatches between the converters, spurious lines 65 are generated in the regions of 128, 256 and 384 MHz with amplitudes in the region of the signal-to-noise limit 66 for an ideal 8-bit converter (i.e., 20 log$2^8$=48.2 dB). Preferably, noise 67 is below the quantization-limited spurious free dynamic range (SFDR) 68 for an 8-bit converter (approximately 8 times 9 dB/bit=72 dB).

The simulation 70 of FIG. 4B corresponds to a system (20 of FIG. 1) of the invention which comprises five converters (M=4 and k=1) that convert analog input signals in accordance with the timing diagram 40 of FIG. 2A (absent the cycle-slipping associated with the broken-line ellipses 42). Although additional spurious lines 71 have been generated, their energy is subtracted from the original spurious lines 65 of FIG. 4A so that a reduction of overall spurious amplitude has been realized.

It is important to note that the clock pattern (prior to cycle slipping) of FIG. 2A has a repetition period of 12 system periods (i.e., the pattern repeats after 12 system periods). The added spurious lines of FIG. 4B and the exchange of energy into these lines is a function of this repetition period which indicates a greater degree of randomness than that obtained with a sequential parallel system.

The simulation 80 of FIG. 4C corresponds to the timing diagram 40 of FIG. 2A in which cycle slipping is randomly selected at each of the 20 broken-line ellipses 42 of FIG. 2A. The energy in the spurious lines of FIG. 4B have now been converted into broad band noise 81 with a consequent rise in noise level (particularly in the regions of 100 and 400 MHz). The spurious lines have been eliminated and the noise floor remains below the quantization-limited SFDR (68 in FIG. 4C) for an 8-bit converter.

In another important feature of the invention, this spectral improvement is realized without introducing idle periods in any converter of the system. As shown in FIG. 2A, all of the converters A–E may be exchanged (e.g., on a random basis) between their respective converter groups at the broken-line ellipses 42 but this exchange only alters the extent of their sample phase. All converters continue to convert samples over continuous periods that do not exceed the largest of the group converter periods.

This feature is particularly important in converters that include switched-capacitor structures. For example, the stages of pipelined converters often form their residue signals with switched-capacitor multiplying digital-to-analog converters (MDACs). If one of these stages is idled for a significant time period, the charges on the capacitors will decay with consequent generation of error in the residue signal and consequent error in downstream conversion.

This becomes a serious problem in conventional systems that use M+k converters but randomly select which converter will convert a subsequent sample and which will be idle. In such systems, random selection means that an idle converter may remain in an idle mode for several converter periods with consequent degradation in the accuracy of its residue signal. In contrast, the invention randomly selects if two converters are exchanged between their respective converter groups but each of these converters will convert either a subsequent sample of one of these converter group or a subsequent sample of the other converter group.

Although this random selection of exchange between converter groups insures that converters are never placed in an idle mode, it is not "as random" as a truly random selection from a bank of idle converters (which would generate idle modes). Accordingly, the noise floor in FIG. 4C is not flat (i.e., the noise is not white noise). If necessary, however, the exchange selection (of the controller 30 of FIG. 1) can be configured on a different basis to move the noise peaks of FIG. 4C (in the region of 100 and 400 MHz) to different regions.

FIGS. 2B, 2C, 2D and 2E are similar to FIG. 2A but show other timing diagram embodiments of the invention. The timing diagram 90 of FIG. 2B assumes that M=2 and k=1 so that converters A, B and C are available. Converter B is a member of a first converter group that is assigned a group converter period of $2/f_S$ and converters A and C are members of a second converter group that is assigned a group converter period of $4/f_S$. The group converter periods are temporally shifted so that each of the samples is processed with at least one of the converters. The timing diagram shows that the basic pattern of the converter clocks A–C has a repetition period of 6 system periods. Converters associated with the broken-line ellipses 92 may be exchanged between their respective converter groups.

The timing diagram 100 of FIG. 2C assumes that M=6 and k=1 so that converters A–G are available. Converters A, B and C are members of a first converter group that is assigned a group converter period of $6/f_S$ and converters D, E, F and G are members of a second converter group that is assigned a group converter period of $8/f_S$. As in FIGS. 2A and 2B, group converter periods are temporally shifted so that each of the samples is processed with at least one of the converters.

The basic pattern of the converter clocks A–G has a repetition period of 24 system periods but this is not shown because of the limited extent of the timing diagram. Converters whose rising clock edges are substantially coincident may be exchanged between their respective converter groups. An exemplary edge coicincidence is shown by the broken-line arrow 102.

The timing diagram 110 of FIG. 2D assumes that M=3 and k=1 so that converters A, B, C and D are available. Converters A and D are members of a first converter group that is assigned a group converter period of $3/f_S$ and converters B and C are members of a second converter group that is assigned a different group converter period. In this embodiment, the different group converter period temporally cycles between periods of $5/f_S$ and $7/f_S$.

As taught above, the various group converter periods are then temporally shifted so that each of the samples is processed with at least one of the converters. The timing diagram 110 shows that the basic pattern of the converter clocks A–C has a repetition period of 12 system periods.

Converters associated with the broken-line ellipses 112 and 114 may be exchanged between their respective converter groups. It was stated above that this exchange may be realized by inserting multiples of the $1/f_S$ system period into the group converter period of one converter and subtracting multiples of the $1/f_S$ system period from another group converter period. Because of the cycling converter period, the multiple is one for exchanges associated with ellipses 112 and two for exchanges associated with ellipses 114.

The teachings of the invention can also be applied to parallel converters that are all running with the same converter period. This is illustrated in the timing diagram 120 of FIG. 2E in which M=3 and k=1 so that converters A, B, C and D are available. The converters process respective ones of the samples in response to respective converter clocks A, B, C and D which each define constant converter periods and a duty-cycle pattern. For example, converter clock D has constant converter periods of $4/f_S$ and a duty-cycle pattern of 5/8, 4/8 and 3/8 wherein duty cycle is defined as a ratio of the clock's high portion to the constant converter period.

As illustrated in FIG. 2E, converter clocks A–D and their duty-cycle patterns are temporally shifted so that each of the samples is processed with at least one of the converters. Instances are then selected where available converters are available to process an upcoming one of the samples. In at least a chosen one of the instances, converter clocks are then exchanged between the available converters to thereby alter which of them processes the upcoming sample and which processes a subsequent sample.

For example, an exemplary instance is defined by the broken-line ellipse 122 that identifies substantially coincident rising clock edges in the converter clocks C and D. Converter clocks are then exchanged so that converter D subsequently responds to clock C and converter C subsequently responds to clock D. This is realized by subtracting a system period from the converter period of clock D and inserting a system period into the converter period of clock C as indicated by broken lines following the ellipse 122. Other broken-line ellipses in FIG. 2E identify other instances where converter clocks may be exchanged between available converters to thereby alter which of them processes an upcoming sample.

Because M=3 in FIG. 2E, it is noted that the maximum rate of the converters is $f_s/3$ which implies minimum high and low clock times of $(1/2)(f_s/3)$ or 1.5 system periods. The duty-cycle pattern insures that these minimum high and low clock times are still available during cycle slipping. If the converters operated with a constant 4/8 duty cycle, for example, cycle slipping would violate the minimum high and low clock times.

Attention is now directed to the use of the timing diagram 90 of FIG. 2B wherein the converters 22 of FIG. 1 are pipelined converter stages that require four converter periods to complete processing of each sample. In this system embodiment, the sample at initial time 94 would be completely processed by converter C at termination time 95. The sample initial time 96 is taken one system period later and will be completely processed by converter B at the termination time 97. However, the termination 97 appears before the termination 95 so that the respective digital codes of converters B and C will be out of sequence if simply taken directly from the converters.

In accordance with the invention, a common delay is associated with each sample and is chosen to be at least as great as the delay through the converter (or converters) that is operating with the greatest group converter period. In FIG. 2B, this is indicated by a first common delay that is initiated at the initial time 94 and extends just past the termination time 95. A second common delay is initiated at the initial time 96 and extends past the end of the first common delay. Thus the digital codes of the converters B and C will be appropriately aligned if they are taken at the ends of the common delays.

This method of preserving output timing is realized in the converter system 20 of FIG. 1 by associating a delay generator 32 with each of the converters 22 and having it commanded by the controller 30. The controller 30 responds to the system clock 26 and provides converter clocks to the converters 22 in accordance with a timing embodiment of the invention (e.g., the diagram 40 of FIG. 2A). With each sample assigned to a specific one of the converters 22, the controller also commands the associated delay generator to begin a common delay. If the converters 22 are pipelined converters, a plurality of common delays 37 will be in process at any given time. At the end of each of these common delays, the gate 34 gates the converted digital code to the output port 35.

As described above, FIG. 4A illustrates spurious signal levels that are obtained with conventional sequenced converters and FIG. 4B illustrates the reduced signal levels obtained with converter systems of the invention as exemplified by the timing diagrams of FIGS. 2A–2D. Finally, FIG. 4C illustrates the reduction of the spurious lines into broad noise with the cycle-slipping teachings of the invention.

It is noted that the energy of the spurious lines is not eliminated in FIG. 4C but, rather, is added to the existing noise energy. The invention recognizes that the noise will rise to levels that degrade the operation of the converter system if care is not taken to previously (i.e., in FIG. 4B) reduce the energy level of the spurious lines below a predetermined level. The invention further recognizes that these reduced energy levels can only be realized with enhanced matching of the converter parameters of the system's converters.

Figure 5:
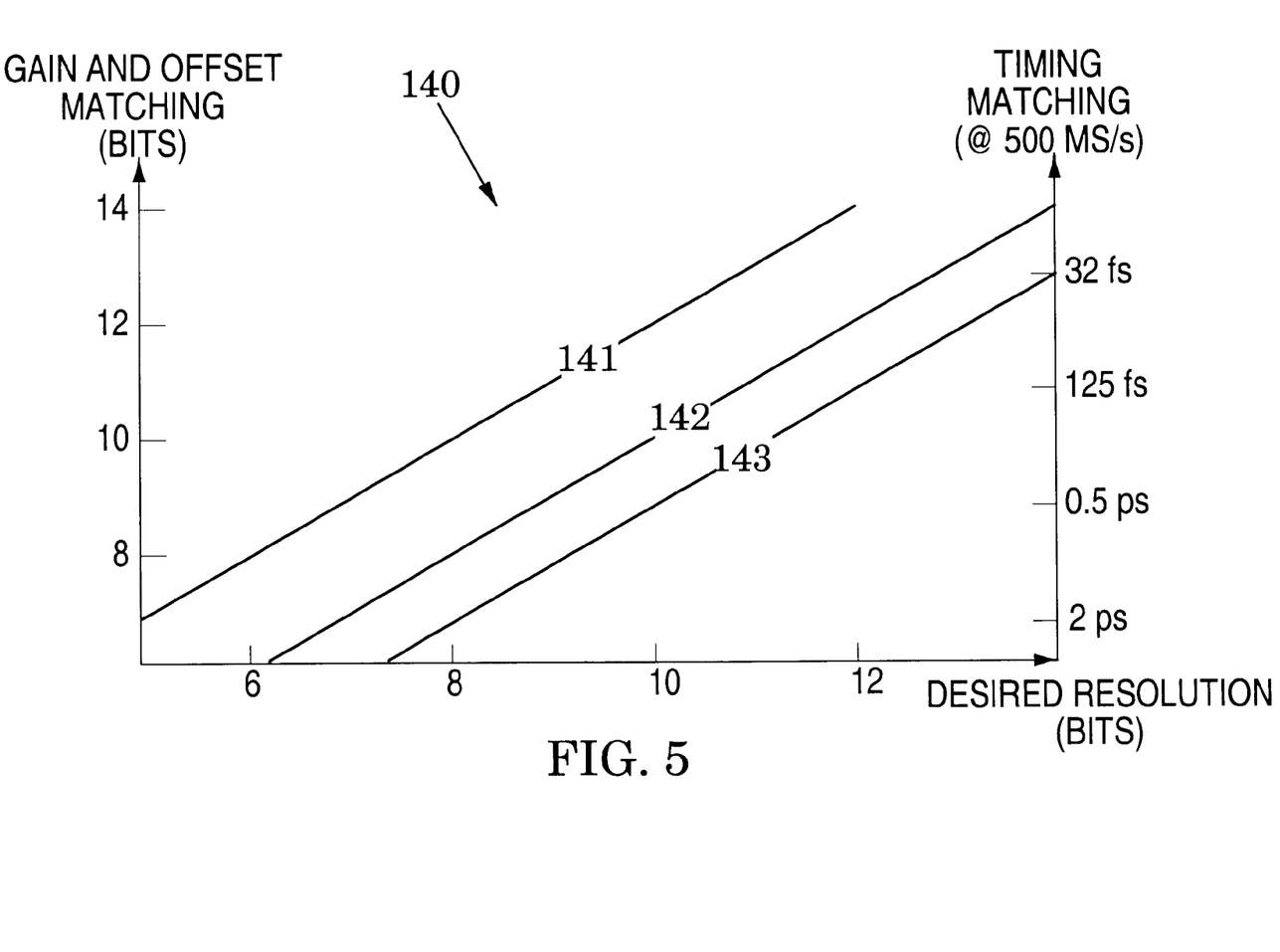
FIG. 5 is a graph that plots desired parameter matching in the converters of FIG. 1.

Accordingly, the invention provides the graph 140 of FIG. 5 which indicates parameter matching that is required to insure that the converter system's signal-to-noise does not degrade more than 3 dB when the reduced spurious signals (e.g., signals 67 in FIG. 4B) are converted into the noise floor (e.g., noise floor 68 in FIG. 4C). The graph provides plots 141, 142 and 143 which correspond respectively to offset, gain and timing matching in systems that sample at a 500 MHz rate (input signals thus limited to 250 MHz).

For example, the graph 140 indicates that offset, gain and timing must be matched respectively to the 10-bit level, to the 8-bit level and below 2 picoseconds for the converters of an 8-bit converter system. Converters matched to these levels would not be acceptable, however, for a 12-bit converter system which would require that offset, gain and timing be matched respectively to the 14-bit level, to the 12-bit level and below 125 femtoseconds.

In contrast to these matching levels for converter systems of the invention, converters in a conventional sequenced system would require significantly greater matching. In an 8-bit conventional system, for example, offset, gain and timing matching must be matched respectively to the 14-bit level, to the 12-bit level and below 125 femtoseconds to reduce their spurious signals (e.g., as shown in FIG. 4A) to the noise floor.

The invention thus provides methods for enhancing the ratio of signal to noise while converting an analog input signal to a corresponding digital code. The conversion is preferably realized with a converter system of parallel analog-to-digital converters to thereby enhance the system rate.

In one process of an exemplary method, at least one of converter offset, converter gain and converter timing is matched in the converters to reduce the ratio of signal plus noise plus distortion to noise plus distortion (SINAD) in the digital code within a selected range (e.g., 3 dB) of the ratio of signal to noise for an ideal converter system. As noted above, the distortion in parallel converter systems primarily consists of spurious signals and the ratio of signal to noise for an ideal converter system converter system that provides an N-bit digital code is $20 \log 2^N$ (wherein the noise region is bounded by the Nyquist rate).

In another process of the exemplary method, the distortion is converted into noise so that spurious signals have been substantially eliminated. Because SINAD is not altered by this conversion process, the system's ratio of signal to noise is substantially that of an ideal converter system.

Preferably, the converting of distortion into noise is realized with the methods and structures of the invention. The matching may be realized by trimming the parallel converters during system start up, during conversion idle times or continuously.

It is noted that the converter system 20 of FIG. 1 includes a system sampler 24 that responds to the system clock 26, i.e., it responds at the system rate $f_S$. More typically, the sampler will be limited to a lower converter rate (e.g., $f_S/M$) and, in such systems, the sampler 26 is replaced by samplers in each of the converters 22.

The controller 30 of FIG. 1 can be realized to control the processes of the invention with various conventional structures, e.g., a system of digital gates or an appropriately-programmed digital processor.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method for reducing spurious signals while converting an analog input signal to a corresponding digital code at a system rate $f_S$, comprising the steps of:
   providing samples of said analog input signal in successive $1/f_S$ system periods;
   partitioning a plurality of analog-to-digital converters into at least two converter groups which are assigned different respective group converter periods that are multiples of said system periods;
   with converters in each of said converter groups, processing respective samples over that group's respective group converter period; and
   temporally shifting the group converter periods of all of said converters to process each of said samples with at least one of said converters.

2. The method of claim 1, wherein:
   one of said converter groups comprises one converter that processes respective samples over a respective group converter period of $2/f_S$; and
   another one of said converter groups comprises two converters that process respective samples over a respective group converter period of $4/f_S$.
   said system rate $f_S$ thereby realized with converters that process said samples up to a maximum converter rate $f_s/2$.

3. The method of claim 1, wherein:
   one of said converter groups comprises two converters that processes respective samples over a respective group converter period of $4/f_S$; and
   another one of said converter groups comprises three converters that processes respective samples over a respective group converter period of $6/f_S$;
   said system rate $f_S$ thereby realized with converters that process said samples up to a maximum converter rate $f_s/4$.

4. The method of claim 1, wherein:
   one of said converter groups comprises three converters that processes respective samples over a respective group converter period of $6/f_S$; and
   another one of said converter groups comprises four converters that process respective samples over a respective group converter period of $8/f_S$.
   said system rate $f_S$ thereby realized with converters that process said samples up to a maximum converter rate $f_s/6$.

5. The method of claim 1, further including the step of temporally cycling the respective group converter period of at least one of said converter groups between at least first and second different periods.

6. The method of claim 1, wherein:
   one of said converter groups comprises two converters that processes respective samples over a respective group converter period of $3/f_S$; and
   another one of said converter groups comprises two converters that process respective samples over a respective group converter period that temporally cycles between a period of $5/f_S$ and a period of $7/f_S$.
   said system rate $f_S$ thereby realized with converters that process said samples up to a maximum converter rate $f_s/3$.

7. The method of claim 1, further including the steps of:
   detecting instances when available converters that belong to different converter groups are available to process an upcoming one of said samples; and
   in at least a chosen one of said instances, exchanging said available converters between their different converter groups to thereby alter which of said available converters processes said upcoming sample.

8. The method of claim 7, further including the step of pseudorandomly selecting said chosen instances.

9. The method of claim 7, further including the step of randomly selecting said chosen instances.

10. The method of claim 7, wherein said detecting step includes the steps of:
    initiating processing in said converters with clock signals that have clock edges; and
    sensing substantial coincidence between clock edges corresponding to said available converters.

11. The method of claim 7, wherein said exchanging step includes the steps of:
    inserting multiples of a $1/f_S$ system period into a group converter period of one of said available converters; and
    subtracting multiples of a $1/f_S$ system period from a group converter period of another of said available converters.

12. The method of claim 1, further including the steps of:
    associating a common delay time with each of said samples; and
    for each of said samples, extracting, at the termination of its respective common delay time, corresponding digital code from the converter processing that sample.

13. The method of claim 1, further including the step of, in each of said converters, processing respective samples through N converter stages.

14. A method for reducing spurious signals while converting an analog input signal to a corresponding digital code at a system rate $f_S$, comprising the steps of:
    providing samples of said analog input signal in successive $1/f_S$ system periods;
    providing a plurality of analog-to-digital converters that process respective ones of said samples in response to respective converter clocks which each define constant converter periods and a duty-cycle pattern;
    temporally shifting said converter clocks and their duty-cycle patterns to process each of said samples with at least one of said converters;
    detecting instances when available converters are available to process an upcoming one of said samples; and
    in at least a chosen one of said instances, exchanging converter clocks between said available converters to thereby alter which of said available converters processes said upcoming sample.

15. The method of claim 14, wherein:
    said converter clocks have high and low portions and have duty cycles defined by a ratio of said high portion to said constant converter period;
    said constant converter period is $4/f_S$; and
    said duty-cycle pattern is 5/8, 4/8 and 3/8.

16. The method of claim 14, wherein said exchanging step includes the steps of:
    inserting multiples of a $1/f_S$ system period into a converter period of one of said available converters; and
    subtracting multiples of a $1/f_S$ system period from a converter period of another of said available converters.

17. The method of claim 14, further including the step of pseudorandomly selecting said chosen instances.

18. The method of claim 14, further including the step of randomly selecting said chosen instances.

19. The method of claim 14, wherein:
said converter clocks have clock edges; and
said detecting step includes the step of sensing substantial coincidence between clock edges corresponding to said available converters.

20. The method of claim 14, further including the step of, in each of said converters, processing respective samples through N converter stages.

21. A method for enhancing the ratio of signal to noise while converting an analog input signal to a corresponding digital code, comprising the steps of:
processing said analog input signal to said digital code with a converter system of parallel analog-to-digital converters;
matching at least one of converter offset, converter gain and converter timing in said converters to reduce the ratio of signal plus noise plus distortion to noise plus distortion in said digital code within a selected range of the ratio of signal to noise for an ideal converter system; and
converting said distortion into noise.

22. The method of claim 21, wherein said converter system provides an N-bit digital code and said ratio of signal to noise for an ideal converter system is $20 \log 2^N$.

23. The method of claim 21, wherein said selected range is 3 dB.

24. The method of claim 21, wherein said converting step includes the steps of:
operating said system at a system rate $f_S$ with samples of said analog input signal provided in successive $1/f_S$ system periods;
partitioning said converters into at least two converter groups which are assigned different respective group converter periods that are multiples of said system periods;
with converters in each of said converter groups, processing respective samples over that group's respective group converter period;
temporally shifting the group converter periods of all of said converters to process each of said samples with at least one of said converters;
detecting instances when available converters that belong to different converter groups are available to process an upcoming one of said samples; and
in at least a chosen one of said instances, exchanging said available converters between their different converter groups to thereby alter which of said available converters processes said upcoming sample.

25. The method of claim 21, wherein said converting step includes the steps of:
operating said system at a system rate $f_S$ with samples of said analog input signal provided in successive $1/f_S$ system periods;
providing a plurality of analog-to-digital converters that process respective ones of said samples in response to respective converter clocks which each define constant converter periods and a duty-cycle pattern;
temporally shifting said converter clocks and their duty-cycle patterns to process each of said samples with at least one of said converters;
detecting instances when available converters are available to process an upcoming one of said samples; and
in at least a chosen one of said instances, exchanging converter clocks between said available converters to thereby alter which of said available converters processes said upcoming sample.

26. An analog-to-digital converter system that converts an analog input signal to a corresponding digital code at a system rate $f_S$, comprising:
at least one sampler that provides samples of said analog input signal in successive $1/f_S$ system periods;
a plurality of analog-to-digital converters; and
a controller that is configured to:
 a) partition said converters into at least two converter groups which are assigned different respective group converter periods that are multiples of said system periods;
 b) direct converters in each of said converter groups to process respective samples over that group's respective group converter period; and
 c) temporally shift the group converter periods of all of said converters to process each of said samples with at least one of said converters.

27. The system of claim 26, wherein said controller is further configured to:
detect instances when available converters that belong to different converter groups are available to process an upcoming one of said samples; and
in at least a chosen one of said instances, exchange said available converters between their different converter groups to thereby alter which of said available converters processes said upcoming sample.

28. The system of claim 26, wherein said controller is further configured to:
associate a common delay time with each of said samples; and
for each of said samples, extract, at the termination of its respective common delay time, corresponding digital code from the converter processing that sample.

29. An analog-to-digital converter system that converts an analog input signal to a corresponding digital code at a system rate $f_S$, comprising:
at least one sampler that provides said samples in successive $1/f_S$ system periods;
a plurality of analog-to-digital converters; and
a controller that is configured to:
provide said converters with respective converter clocks which each define constant converter periods and a duty-cycle pattern;
temporally shift said converter clocks and their duty-cycle patterns to process each of said samples with at least one of said converters;
detect instances when available converters are available to process an upcoming one of said samples; and
in at least a chosen one of said instances, exchange converter clocks between said available converters to thereby alter which of said available converters processes said upcoming sample.

30. The system of claim 29, wherein said controller is further configured to:
insert multiples of a $1/f_S$ system period into a converter period of one of said available converters; and
subtract multiples of a $1/f_S$ system period from a converter period of another of said available converters.

31. The system of claim 29, wherein said controller is further configured to randomly select said chosen instances.

32. The system of claim 29, wherein said controller is further configured to pseudorandomly select said chosen instances.

* * * * *